United States Patent
Iwazaki et al.

(10) Patent No.: US 6,940,175 B2
(45) Date of Patent: Sep. 6, 2005

(54) SEMICONDUCTOR DEVICE IN WHICH A PLURALITY OF ELECTRONIC COMPONENTS ARE COMBINED WITH EACH OTHER

(75) Inventors: Yoshihide Iwazaki, Tenri (JP); Toshiya Ishio, Nabari (JP); Hiroyuki Nakanishi, Kitakatsuragi-gun (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 37 days.

(21) Appl. No.: 10/163,497

(22) Filed: Jun. 7, 2002

(65) Prior Publication Data
US 2002/0190392 A1 Dec. 19, 2002

(30) Foreign Application Priority Data
Jun. 14, 2001 (JP) .................................. 2001-180681

(51) Int. Cl.[7] .................... H01L 23/48; H01L 23/52; H01L 29/40
(52) U.S. Cl. .................. 257/777; 257/778; 257/780; 257/783
(58) Field of Search ................ 257/777, 778, 257/780, 783

(56) References Cited

U.S. PATENT DOCUMENTS

| | | | | |
|---|---|---|---|---|
| 5,508,561 A | * | 4/1996 | Tago et al. | 257/737 |
| 5,783,865 A | * | 7/1998 | Higashiguchi et al. | 257/774 |
| 5,869,886 A | * | 2/1999 | Tokuno | 257/678 |
| 6,046,499 A | * | 4/2000 | Yano et al. | 257/712 |
| 6,177,730 B1 | * | 1/2001 | Kira et al. | 257/778 |
| 6,188,127 B1 | * | 2/2001 | Senba et al. | 257/686 |
| 6,219,911 B1 | * | 4/2001 | Estes et al. | 29/840 |
| 6,297,562 B1 | * | 10/2001 | Tilly | 257/780 |
| 6,410,415 B2 | * | 6/2002 | Estes et al. | 438/612 |
| 6,420,783 B2 | * | 7/2002 | Wada et al. | 257/724 |
| 6,486,562 B1 | * | 11/2002 | Kato | 257/778 |
| 6,621,168 B2 | * | 9/2003 | Sundahl et al. | 257/778 |
| 2002/0180063 A1 | * | 12/2002 | Iwaki et al. | 257/778 |

FOREIGN PATENT DOCUMENTS

| | | |
|---|---|---|
| JP | 07-221104 | 8/1995 |
| JP | 07-249632 | 9/1995 |
| JP | 08-288291 A | 11/1996 |
| JP | 10-056041 A | 2/1998 |
| JP | 10-154726 | 6/1998 |
| JP | 11-040716 | 2/1999 |
| JP | 11-312711 A | 11/1999 |
| JP | 2001-085459 A | 3/2001 |
| JP | 2001-189337 A | 7/2001 |

\* cited by examiner

*Primary Examiner*—Mary Wilczewski
*Assistant Examiner*—Monica Lewis
(74) *Attorney, Agent, or Firm*—Birch, Stewart, Kolasch & Birch, LLP (57) ABSTRACT

A semiconductor device includes (i) spacers between a first electronic component and a second electronic component facing each other, for keeping a distance between the first and second electronic components constant and (ii) combining parts for combining the first electronic component with the second electronic component. The spacers are made of liquid resin material made of thermosetting resin, and the combining parts are made of liquid conductive combining material including metal and thermosetting resin. A manufacturing method of the semiconductor device includes the steps of: forming the spacers on first electrode pads by hardening the liquid resin material; providing the liquid conductive combining material on either the first electrode pads or second electrode pads; aligning the first electronic component with the second electronic component so that (i) the spacers contact with the second electrode pads and (ii) the liquid conductive combining material contact with either at least a part of one the first electrode pads or at least part of one of the second electrode pads; and combining the first electronic component with the second electronic component by hardening the liquid conductive combining material. The steps above are carried out in this order.

10 Claims, 10 Drawing Sheets

SEMICONDUCTOR DEVICE IN WHICH A PLURALITY OF ELECTRONIC COMPONENTS ARE COMBINED WITH EACH OTHER

FIELD OF THE INVENTION

The present invention relates to a semiconductor device in which a plurality of electronic components such as a semiconductor chip and a wiring substrate is combined with each other, and a manufacturing method thereof.

BACKGROUND OF THE INVENTION

A conventional method of combining a semiconductor chip with a substrate is such that spacers for controlling space are provided on either the semiconductor chip or the substrate, for keeping a space between a device-formed surface of the semiconductor chip and a circuit-formed surface of the substrate constant.

Figure 8:
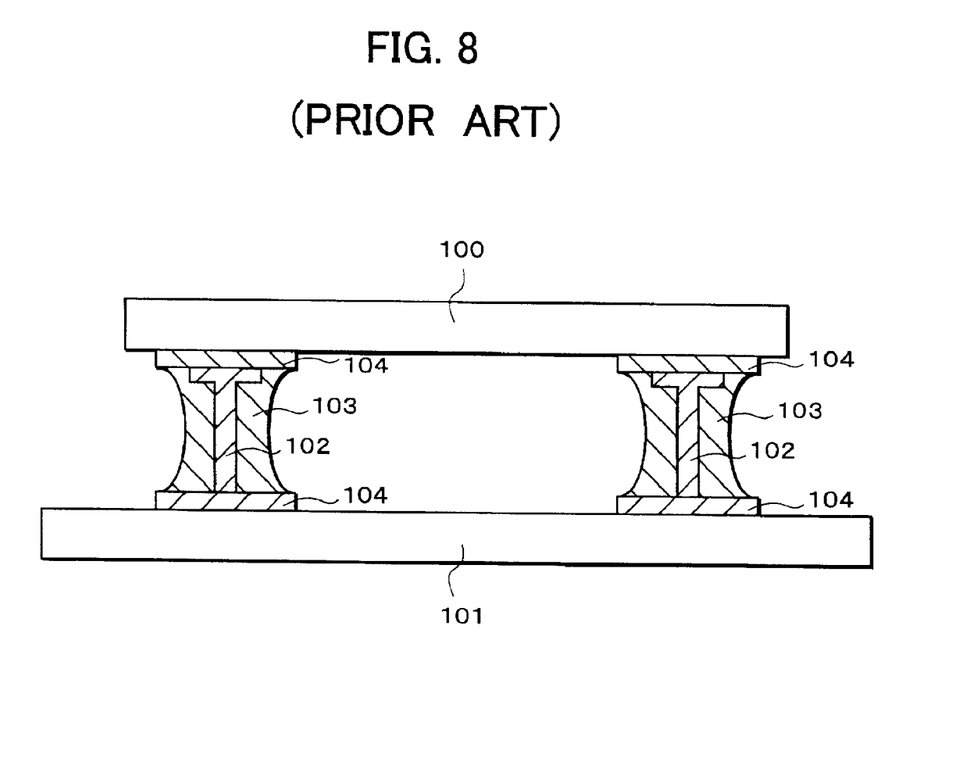
FIG. 8 is a cross section illustrating an arrangement of essential parts of a conventional semiconductor device.

For instance, as FIG. 8 illustrates, Japanese Laid-Open Patent Application No. 7-249632/1995 (Tokukaihei 7-249632; published on Sep. 26, 1995; conventional art (A)) discloses a semiconductor device in which core parts 102 are used for the spacers to keep a space between a device-formed surface of a semiconductor chip 100 and a circuit-formed surface of a substrate 101 constant.

Between the semiconductor chip 100 and the substrate 101, the core parts 102, solder bumps 103, and external electrode pads 104 are provided. The core parts 102, which are made of metal and have a melting point higher than that of the solder bumps 103, are attached to the external electrode pad 104 using solder (not illustrated).

In the case of flip chip mounting, the core parts 102 are bonded on the external electrode pads 104 on the semiconductor chip 100 using solder which is not illustrated and has a melting point higher than that of the solder bumps 103, and the semiconductor chip 100 is connected to the solder bumps 103 formed on the external electrode pads 104 on the substrate 101.

Figure 9:
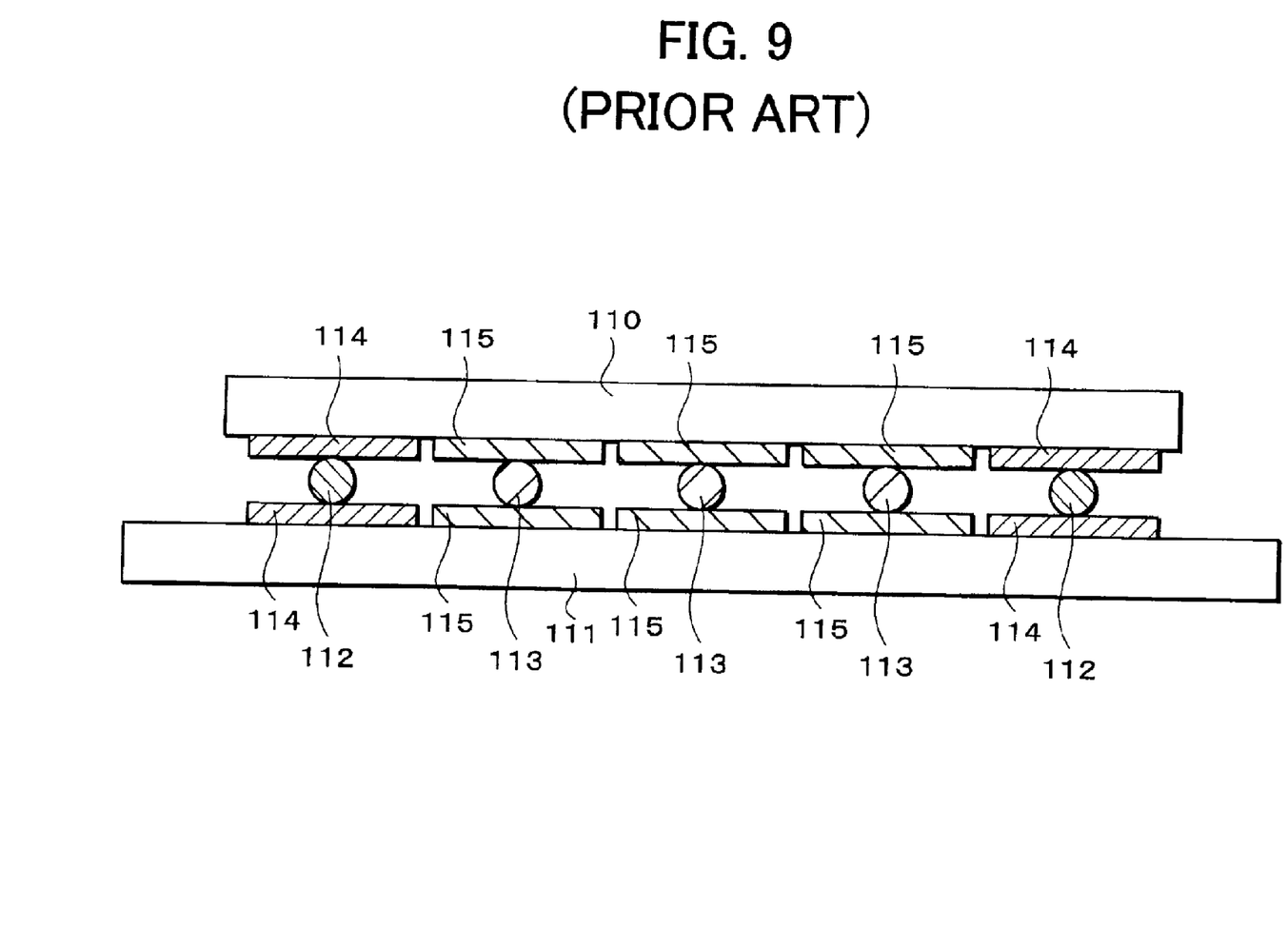
FIG. 9 is a cross section illustrating an arrangement of essential parts of another conventional semiconductor device.

Moreover, for instance, as illustrated in FIG. 9, Japanese Laid-Open Patent Application No. 10-154726/1998 (Tokukaihei 10-154726; published on Jun. 9, 1998; conventional art (B)) discloses a semiconductor device in which gold bumps 112, which have a melting point higher than that of the solder bumps 113 which are for combining the semiconductor chip 110 with the substrate 111, are used as the spacers.

On the semiconductor chip 110, dummy electrode pads 114 which are electrically isolated from predetermined conductive parts on the semiconductor chip 110 and external electrode pads 115 which are electrically connected to the conductive parts on the semiconductor chip 110 are provided. Likewise, the dummy electrodes 114 and the external electrode pads 115 are also provided on the substrate 111.

The external electrode pads 115 on the substrate 111 and the external electrode pads 115 on the semiconductor chip 110 are provided so as to face each other via the solder bumps 113, and thus these two sets of the electrode pads are electrically connected. Also, the dummy electrode pads 114 on the substrate 111 and the dummy electrode pads 114 on the semiconductor chip 110 are provided so as to face each other via the gold bumps 112. It is thus possible to keep a predetermined space between the substrate 111 and the semiconductor chip 110.

Figure 10:
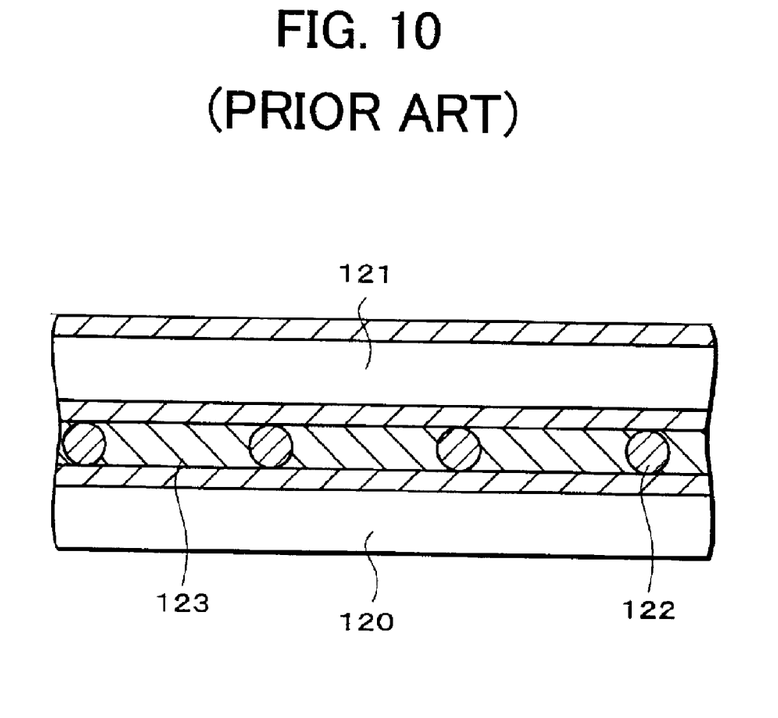
FIG. 10 is a cross section illustrating an arrangement of essential parts of a further conventional semiconductor device.

Furthermore, for instance, as illustrated in FIG. 10, Japanese Laid-Open Patent Application No. 11-40716/1999 (Tokukaihei 11-40716; published on Feb. 12, 1999; conventional art (C)) discloses a semiconductor device in which the space is kept to be constant using conductive particles 122 as the spacers.

As the figure shows, the semiconductor device is arranged such that the conductive particles 122 are interfused in an electrode combining solder 123. In this manner, it is possible to keep the space between a substrate 121 and a metal base 120 constant at a diameter of the conductive particles 122.

Furthermore, Japanese Laid-Open Patent Application No. 7-221104/1995 (Tokukaihei 7-221104; published on Aug. 18, 1995; conventional art (D)) discloses a semiconductor device which is provided with electrode pins each having identical height. The electrode pins are formed on the external electrode pads of the semiconductor chip, by forming conductive combining material (thermosetting resin mixed with metal particles) by a printing method so as to thermoset the same. Then the semiconductor chip and the substrate are combined with each other by a method such that a solder is provided on a tip of each of the electrode pins and then the electrode pins are provided downward toward the substrate so as to be heated. In this manner, this semiconductor device is arranged so that the electrode pins are used as the spacers and the semiconductor chip is combined with the substrate using solder.

However, the above-identified constitutions have problems as described below.

The constitution disclosed in the conventional art (A) is arranged so that the core parts 102 are connected to the external electrode pads 104 using the solder which is not illustrated. Thus, when manufacturing the semiconductor device, this constitution requires the steps of: forming solder paste, which is for connecting the core parts 102 to the external electrode pads 104, on the external electrode pads 104 on the semiconductor chip 100 by printing, etc.; mounting the core parts 102 on the solder paste formed on the external electrode pads 104; and connecting the external electrode pads 104 to the core parts 102 by reflow-soldering the solder paste. Consequently, a number of manufacturing steps are required so that there is a limit to reduce the cycle time.

The constitution disclosed in the conventional art (B) includes the gold bumps 112 for keeping the space and the solder bumps 113 for combining. Thus this constitution requires either: forming the gold bumps 112 and the solder bumps 113 through wire bonding; or forming the gold bumps 112 through wire bonding whereas forming the solder bumps 113 through solder plating. Thus a number of manufacturing steps are required so that there is a limit to reduce the cycle time.

The constitution disclosed in the conventional art (C) is arranged so that the electrode connecting solder 123, in which the conductive particles 122 are interfused, is formed on the metal base 120 by a method such as printing using a stencil plate and discharging from a dispense nozzle. In this constitution, the diameter of the conductive particles 122 must be smaller than (i) a circle inscribing the diameter of the smallest opening in a pattern formed on the stencil plate or (ii) the diameter of the dispense nozzle.

Generally, for instance, when the space between a plurality of combined semiconductor chips or the space between the semiconductor chip and the wiring substrate being combined with each other is filled with liquid resin for improving the reliability of the semiconductor device, the thickness of the space is an important factor of determining the state of the filled liquid resin.

However, it is difficult to make the space between the plurality of semiconductor chips or between the semiconductor chip and the wiring substrate not narrower than the diameter of the circle inscribing the smallest opening in the pattern formed on the stencil printing plate or the diameter of the dispense nozzle, i.e. not narrower than the diameter of a circle inscribing the facing external electrode pads.

More specifically, in the case of the constitution disclosed in the conventional art (C), it is difficult to make the space between the metal base 120 and the substrate 121 not narrower than the diameter of the circle inscribing the smallest opening in the pattern formed on the stencil plate or the diameter of the dispense nozzle.

Moreover, the constitutions disclosed in conventional arts (A), (B), (C), and (D) use solder to combine the semiconductor chip with the substrate. In these cases, generally flux is provided on the combining surface so that a step for removing the flux is required after the combining. This brings about the increase of the number of manufacturing steps and hence there is a limit to reduce the cycle time.

Furthermore, the combining process using solder requires a temperature around 260° C. Thus, when the post-thermoset thermosetting resin is adopted as in the constitution disclosed in the conventional art (D), the thermosetting resin could be degraded or deformed on the occasion of the combining process using solder.

As described above, using solder for combining the plurality of semiconductor chips with each other or combining the semiconductor chip with the substrate gives rise to the increase of the manufacturing steps and requires high temperature for the combining since the melting point of solder is high. Moreover, when particles are utilized as the spacers and the thickness of the space is determined by the diameter of the particles, there is a limit to the thickness of the space between the plurality of semiconductor chips or between the semiconductor chip and the wiring substrate.

SUMMARY OF THE INVENTION

The main objective of the present invention is to provide a semiconductor device which has no restraint on the distance between electronic components being combined with each other and can be manufactured with fewer steps, and a manufacturing method thereof.

To achieve the above-identified objective, the manufacturing method of the semiconductor device in accordance with the present invention, in which a first electronic component and a second electronic component face each other and are combined with each other via spacers for keeping a distance between the first electronic component and the second electronic component constant, includes the steps of: (a) forming the spacers on first electrode pads provided on the first electronic component, by hardening liquid resin material made of thermosetting resin; (b) providing liquid conductive combining material, which is made of metal and thermosetting resin, either on second electrode pads provided on the second electronic component or on the first electrode pads; (c) aligning the first electronic component with the second electronic component so that (i) the spacers contact with the second electrode pads and (ii) the liquid conductive combining material contact with either at least a part of one of the first electrode pads or at least a part of one of the second electrode pads; and (d) combining the first electronic component with the second electronic component by hardening the liquid conductive combining material, the steps (a) through (d) being carried out in this order.

When the electronic components are combined with each other by solder, flux is generally used so that a step for providing the flux on the combining surface and a step for removing the flux are required.

However, according to the above-identified manufacturing method, the liquid conductive combining material for combining the first electronic component with the second electronic component includes metal so as to be conductive. Thus, due to the liquid conductive combining material, the first electrode pads on the first electronic component can be electrically connected to the second electrode pads on the second electronic component, and at the same time, the first electronic component can be physically combined with the second electronic component. In this manner, it is unnecessary to use the flux. Moreover, in the whole manufacturing steps of the semiconductor device, it is unnecessary to use solder to combine, for instance, the first and second electrode pads with other members, and hence fewer manufacturing steps are required.

Thus the cycle time can be reduced, and consequently the productive efficiency is improved. Furthermore, lead is not used in any one of manufacturing steps of the semiconductor device so that this arrangement does not have an adverse effect on the environment.

Generally, a temperature around 260° C. is required to combine the electronic components with each other using solder.

However, when the first and second electronic components are combined with each other using the liquid conductive combining material which includes metal and thermosetting resin, a temperature required for the combining is around 160° C. Thus it is possible to prevent the degradation and deformation of the spacers which are formed beforehand by hardening the liquid resin material made of thermosetting resin.

Moreover, according to the arrangement above, after the spacers are formed by hardening the liquid conductive combining material in the step (a), the first electronic component is combined with the second electronic component by hardening the liquid conductive combining material in the step (d). Thus it is possible to regulate the thickness of the space between the first and second electronic components by changing the height of the spacers. In this manner, the thickness of the space is regulated by the spacers rather than granular metal, etc. so that, for instance, even if the liquid resin material is formed using a mask and a nozzle, the diameter of the particles in the liquid resin material is small enough and hence this does not limit the thickness of the space. On this account, it is possible to provide a semiconductor device in which the electronic components face each other with an arbitrary distance.

The semiconductor device in accordance with the present invention includes: spacers, provided between first electronic component and second electronic component which face each other, for keeping a distance between the first electronic component and second electronic component constant; and combining parts for combining the first electronic component with the second electronic component, wherein the spacers are made of liquid resin material which is made of thermosetting resin, and the combining parts are made of liquid conductive combining material which is made of metal and thermosetting resin.

According to this arrangement, due to the combining parts, the first electronic component can be electrically connected to the second electronic component, and at the same time, the first electronic component can be physically combined with the second electronic component. In this manner, it is unnecessary to use the flux as in the case of the combining using solder, and hence fewer manufacturing steps are required.

On this account, the cycle time can be reduced, and consequently the productive efficiency is improved.

Moreover, the thickness of the space between the first and second electronic components can be regulated by the spacers rather than granular metal, etc. so that the thickness of the space between the first and second electronic components is not limited. On this account, it is possible to provide a semiconductor device in which the electronic components face each other with an arbitrary distance.

For a fuller understanding of the nature and advantages of the invention, reference should be made to the ensuing detailed description taken in conjunction with the accompanying drawings.

DESCRIPTION OF EMBODIMENTS

[Embodiment 1]

Referring to FIGS. 1 through 5, an embodiment of the present invention will be described below.

Figure 1:
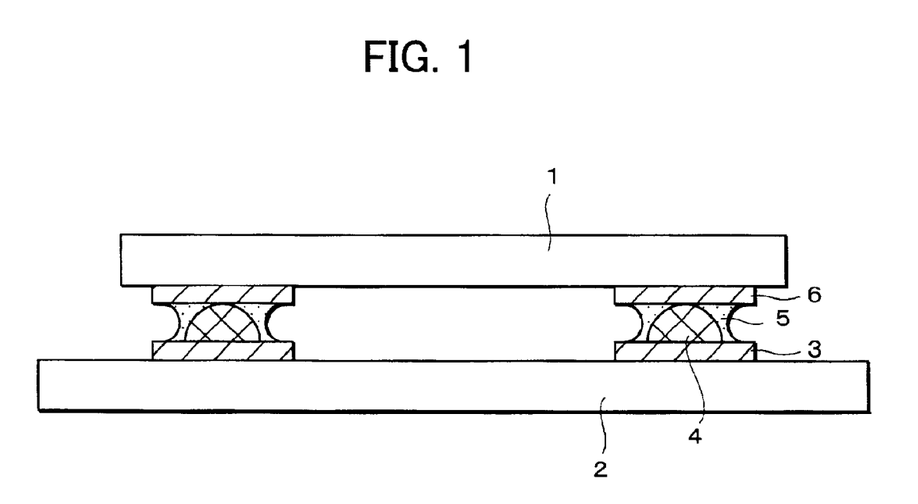
FIG. 1 is a cross section illustrating an arrangement of essential parts of a semiconductor device in accordance with the present invention.

FIG. 1 is a cross section illustrating an arrangement of important parts of a semiconductor device. The semiconductor device in accordance with the present embodiment includes, as FIG. 1 shows, a semiconductor chip (second electronic component) 1, a semiconductor chip (first electronic component) 2, electrode pads (first electrode pads) 3, bumps (spacers) 4, combining parts 5, and electrode pads (second electrode pads) 6.

The semiconductor chips 1 and 2 face each other, and on a surface (bottom surface) of the semiconductor chip 1, the surface facing the semiconductor chip 2, a plurality of the electrode pads 6 is formed in line. On a surface (top surface) of the semiconductor chip 2, the surface facing the semiconductor chip 1, a plurality of the electrode pads 3 is formed in line.

The electrode pads 3 and 6 are made of aluminum and have substantially circular shape 250 μm in diameter. Each of the electrode pads 3 faces each of the corresponding electrode pads 6.

The bumps 4 are made of liquid epoxy resin incorporating silver (below-mentioned epoxy resin 7 including silver). The incorporated silver is in the form of particles 5–10 μm in diameter. Each of the bumps 4 is shaped like a cylinder 180 μm in diameter and 35 μm in height.

The combining parts 5 are formed between the electrode pads 3 and 6 so as to cover the bumps 4. The combining parts 5 are made of conductive combining material which is made of liquid resin including metal and thermosetting resin.

As above stated, the combining parts 5 are provided between the electrode pads 3 and 6 so that the electrode pads 3 are connected to the electrode pads 6. Also, since the bumps 4 are provided between the semiconductor chips 1 and 2, it is possible to determine the space between the semiconductor chip 1 and the semiconductor chip 2 at a predetermined value (height of the bumps 4).

Moreover, both the combining parts 5 and the bumps 4 include metal, and hence both the combining parts 5 and the bumps 4 have conductibility so that it is possible to confirm the electrical connection between the electrode pads 3 and the electrode pads 6.

Incidentally, the material of the electrode pads 3 and 6 is not limited to aluminum so that, for instance, gold may be alternatively adopted.

All of the electrode pads 3 and 6 may sandwich the bumps 4 between the same, however, the present invention is not limited to this arrangement so that it is possible to form the bumps 4 in a selective manner. Also, the particles incorporated in the bumps 4 are not particularly limited as long as the particles are made of conductive metal, and hence not necessarily made of silver.

When the combining parts 5 include metal so as to be conductive, the bumps 4 can be made of any kind of thermosetting resin so that resins not incorporating conductive metal can be adopted. Even so, due to the conductibility of the combining parts 5, the electrode pads 3 can be electrically coupled with the electrode pads 6.

Furthermore, either one of the semiconductor chips 1 and 2 may be a wiring substrate, and the bumps and the combining parts may be formed on the wiring substrate. In this manner, it is possible to provide a semiconductor device in which a semiconductor chip is mounted on a wiring substrate.

Furthermore, when either one of the semiconductor chips 1 and 2 is larger than the other semiconductor chip, a plurality of the smaller semiconductor chips may be juxtaposed on the larger semiconductor chip. This arrangement easily makes it possible to provide a semiconductor device in which a plurality of semiconductor chips is combined with each other.

Referring to FIGS. 2(a) through 4(b), an example of the manufacturing steps of the above-identified semiconductor device will be described below.

First of all, steps until the bumps 4 are formed on the semiconductor chip 2 are described, with reference to FIGS. 2(a) through 2(d).

Figure 2A:
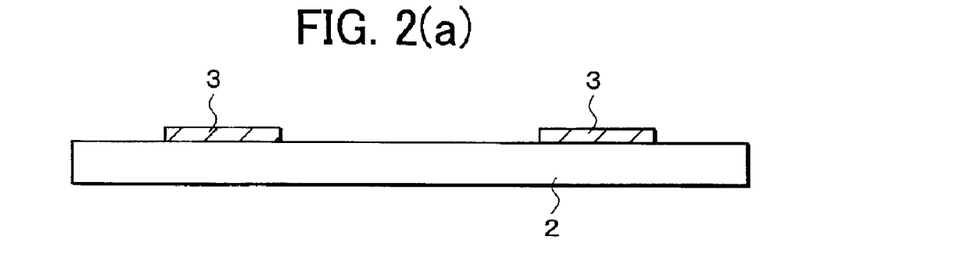
FIGS. 2(a) through 2(d) are flow charts indicating manufacturing steps until bumps are formed, among manufacturing steps of the semiconductor device illustrated in FIG. 1.

On the semiconductor chip 2, the electrode pads 3 each has circular shape and 250 μm in diameter are formed (FIG. 2(a)). Likewise, the electrode pads 6 are formed on the semiconductor chip 1.

Figure 2B:
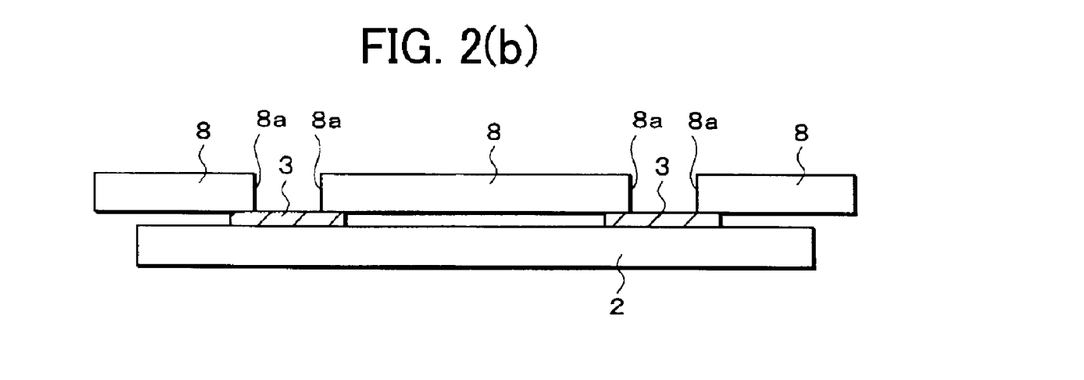

Then a stencil printing plate (mask for spacers) 8, which is made of stainless steel, 50 μm thick, and has circular openings 8a each 150 μm in diameter, is provided so as to be horizontally adjusted to match the openings 8a with the electrode pads 3, using an appropriate device such as an image recognition device (step for providing mask for spacers, FIG. 2(b)).

Figure 2C:
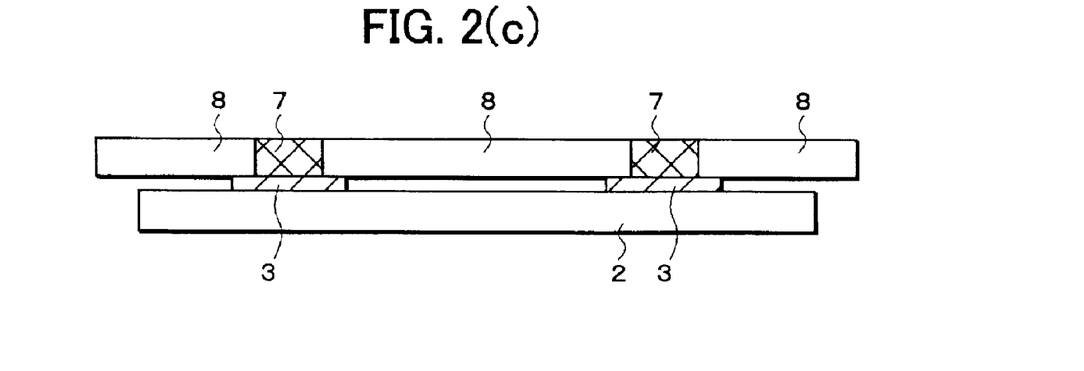

Then using the stencil printing plate 8 and a squeegee (not shown), the epoxy resin (liquid resin material) 7 incorporating silver is printed (step for infusing resin, FIG. 2(c)).

Then the stencil printing plate 8 is removed from the surface of the semiconductor chip 2 so that the epoxy resin 7 is formed on the electrode pads 3 (step for forming resin).

Figure 2D:
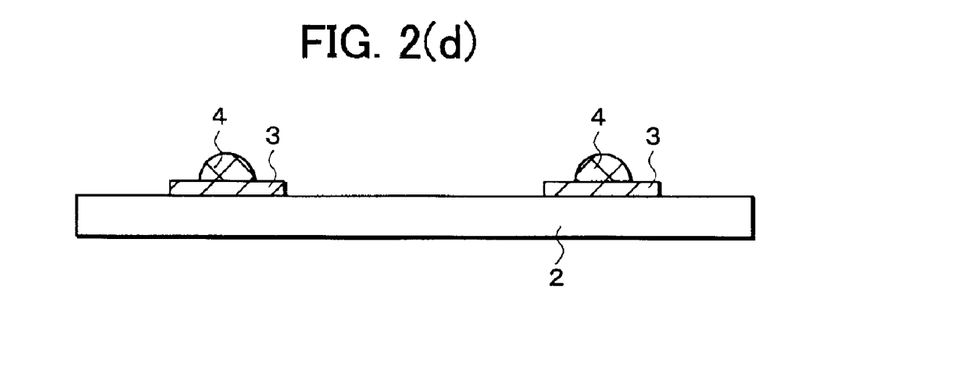
Figure 3:
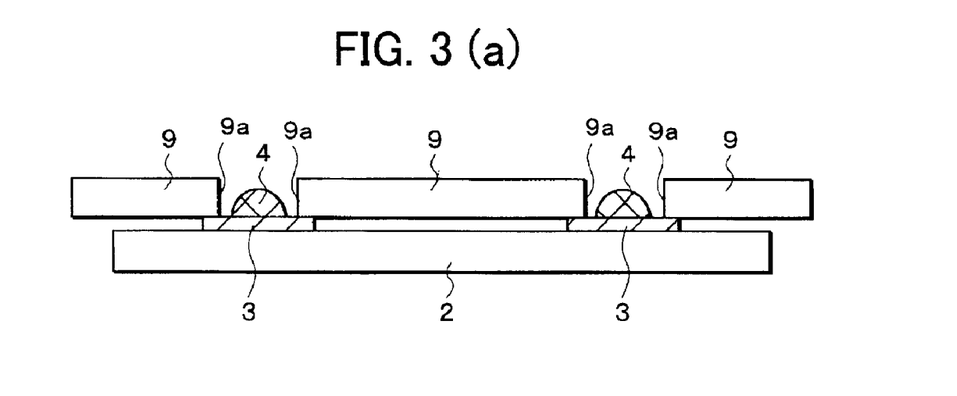
FIGS. 3(a) through 3(c) are flow charts indicating manufacturing steps from the formation of the bumps to the formation of combining parts, among the manufacturing steps of the semiconductor device illustrated in FIG. 1.
Figure 4:
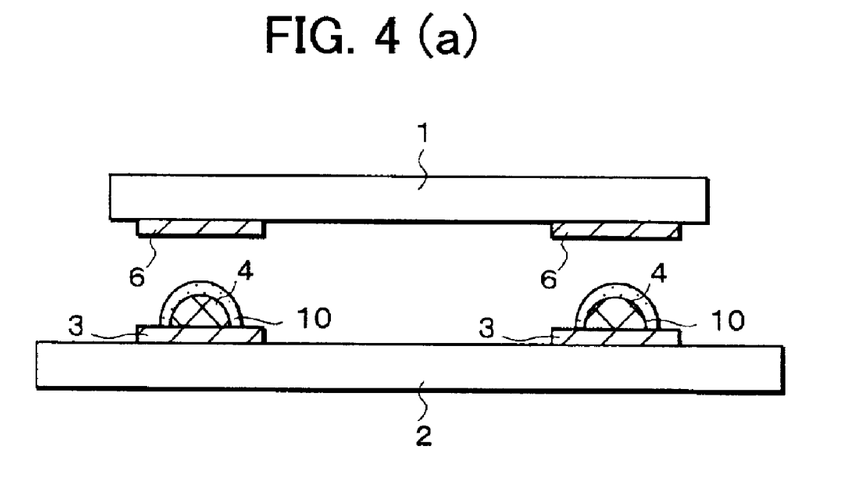
FIGS. 4(a) and 4(b) are flow charts indicating a manufacturing step of combining two semiconductor chips, among the manufacturing steps of the semiconductor device illustrated in FIG. 1.

Then the semiconductor chip 2 on which the epoxy resin is printed is exposed to nitrogen gas and heated for 30 minutes at 160° C., so that the epoxy resin 7 is hardened and the bumps 4 are formed (step for forming spacers, FIG. 2(d)).

In this manner, the bumps 4 are formed on the electrode pads 3 on the semiconductor chip 2.

Incidentally, there are no particular limits to the material, size, and shape of the stencil printing plate 8 and the size and shape of the openings 8a so that, for instance, a stencil printing plate 80 μm thick may be adopted.

As described above, the epoxy resin 7 to be the bumps 4 are printed using the stencil printing plate 8 so that the sets of the epoxy resin 7 are formed on the electrode pads 3 altogether, in other words, it is possible to form all of the bumps 4 on the electrode pads 3 altogether.

This makes it possible to shorten the time required for the steps until the bumps 4 are formed. Moreover, for instance, even if the number of the electrode pads 3 is increased so that the number of the bumps 4, i.e. the number of the sets of the epoxy resin 7 is increased, it is unnecessary to extend the time required for the steps (the step for providing mask for spacers, the step for infusing resin, and the step for forming resin) until the bumps 4 are formed. Consequently, it is possible to improve the productive efficiency.

Moreover, adjusting the size of the openings 8a of the stencil printing plate 8 makes it possible to acquire spacers each having desirable size. Thus, it is possible to arbitrarily determine the size of the bumps 4 and hence it is possible to arbitrarily determine the thickness of the space between a plurality of the electronic components such as the semiconductor chips 1 and 2, when the components are combined with each other.

It is noticed that the number of the bumps 4 is not particularly limited so that it is not necessary to form the bumps 4 on every electrode pad 3.

Next, referring to FIGS. 3(a) through 3(c), what is described below is steps (collectively termed a step for arranging combining material) until conductive combining material 10 to be combining parts 5 is formed on the semiconductor chip 2 on which the bumps 4 are formed.

A stencil printing plate (combining mask) 9, which is made of stainless steel, 80 μm thick, and has circular openings (combining openings) 9a 200 μm in diameter, is provided so as to be horizontally adjusted to match the openings 9a with the electrode pads 3 and the bumps 4, using an appropriate device such as the image recognition device (step for providing combining mask, FIG. 3(a)). The openings 9a correspond to arbitrary electrode pads 3 including all of the electrode pads 3 on which the bumps 4 are formed.

Then using the stencil printing plate 9 and a squeegee (not shown), the conductive combining material (liquid conductive combining material) 10, which is made of liquid resin containing metal and thermosetting resin, is printed (step for infusing combining resin, FIG. 3(b)).

Then the stencil printing plate 9 is removed from the semiconductor chip 2 (step for forming combining resin, FIG. 3(c)). At this moment, each of the sets of the conductive combining material 10, which becomes the combining part 5 later, is made of liquid resin so as to spontaneously take a rounded shape.

In this manner, the conductive combining material 10, which becomes the combining parts 5 in subsequent steps, is formed so as to cover the bumps 4.

The conductive combining material 10 may be formed on the semiconductor chip 1 facing the semiconductor chip 2 on which the bumps 4 are formed. That is, the conductive combining material 10 is formed on either of the semiconductor chips 1 and 2 on which the hardened bumps 4 are formed or on which the bumps 4 are not formed.

Also, there are no particular limits to the material, size, and shape of the stencil printing plate 9 and the size and shape of the openings 9a so that, for instance, the stencil printing plate 9 is not necessarily 80 μm thick.

The combining parts 5 may be formed on the electrode pads 3 on which the bumps 4 are not formed. In other words, it is possible to print the conductive combining material 10 on the electrode pads 3 on which the bumps 4 are not formed, and form the combining parts 5.

As described above, by printing with the use of the stencil printing plate 9, it is possible to form all of the sets of the conductive combining material 10 altogether on the electrode pads 3 on the semiconductor chip 2 (on the electrode pads 6 on the semiconductor chip 1, when the combining parts 5 are provided on the semiconductor chip 1), In other words, it is possible to combine the semiconductor chip 1 with the semiconductor chip 2 at once.

On this account, it is possible to shorten the time required for the steps illustrated in FIGS. 3(a) through 3(c), which are until the formation of the conductive combining material 10 to be the combining parts 5, and hence the productive efficiency can be improved.

Then referring to FIGS. 4(a) and 4(b), a step for combining the semiconductor chip 1 with the semiconductor chip 2 will be described below.

The semiconductor chip 2, on which the bumps 4 and the conductive combining material 10 are formed, is mounted on a bonding stage of a flip chip bonder (not shown). When mounted, the top surface of the semiconductor chip 2 turns up, i.e. the bottom surface thereof faces the bonding stage. In the meantime, the semiconductor chip 1 is vacuum-attached to a bonding tool of the flip chip bonder (FIG. 4(a)).

After the process above, the electrode pads 6 and the corresponding electrode pads 3 are aligned so as to face each other, by horizontally moving the bonding tool (step for aligning). Then the bonding tool is moved downward until the electrode pads 6 make contact with the corresponding bumps 4, so that the semiconductor chip 1 is mounted on the semiconductor chip 2. Further, the semiconductor chips are exposed to nitrogen gas and heated for 30 minutes at 160° C., so that the conductive combining material 10 is hardened to be the combining parts 5, and consequently the chips are combined with each other (step for hardening combining members, FIG. 4(b)).

On this account, the electrode pads 3 and 6 are connected via the combining parts 5, and the space between the pads is kept constant at the height of the bumps 4.

Generally, a temperature around 260° C. is required to combine the electronic components such as the semiconductor chip and the wiring substrate with each other using solder. When lead-free solder is used, the temperature required for combining (combining temperature) is around 280° C.

In this kind of case, if the bumps 4 are formed by hardening the epoxy resin 7 before combining the electronic components with each other, the electronic components, in this case the semiconductor chip 1 and the semiconductor chip 2, are combined, the epoxy resin 7 for forming the bumps 4 is degraded and deformed since the combining temperature is high. The degradation and deformation of the epoxy resin 7 decrease the shear strength of the bumps 4 and reliability of the semiconductor device including the bumps 4.

However, when the semiconductor chips 1 and 2 are combined with each other using the conductive combining material 10, the combining temperature is around 160° C. Thus it is possible to prevent the degradation and deformation of the bumps 4 which are formed beforehand by hardening the epoxy resin 7, and consequently the degradation of the shear strength of the bumps 4 can be prevented.

Figure 5:
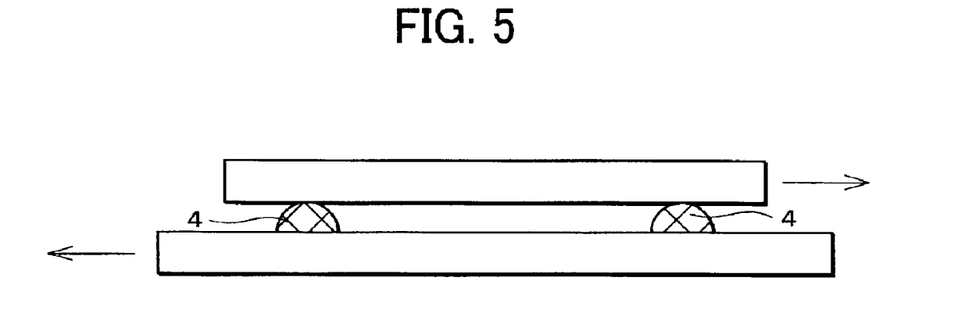
FIG. 5 illustrates shear strength.
Figure 6:
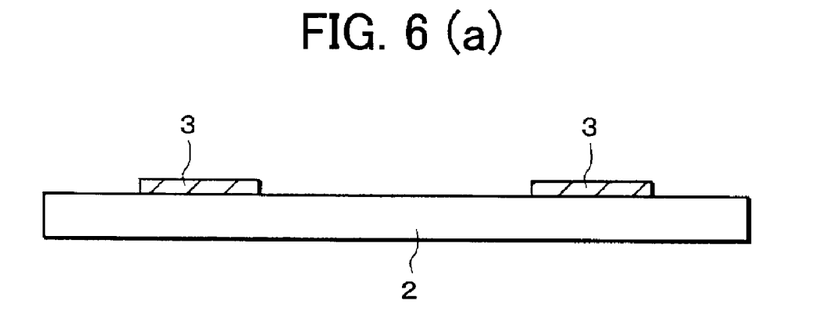
FIGS. 6(a) through 6(c) are flow charts indicating manufacturing steps until bumps are formed, among alternative manufacturing steps of the semiconductor device illustrated in FIG. 1.
Figure 7:
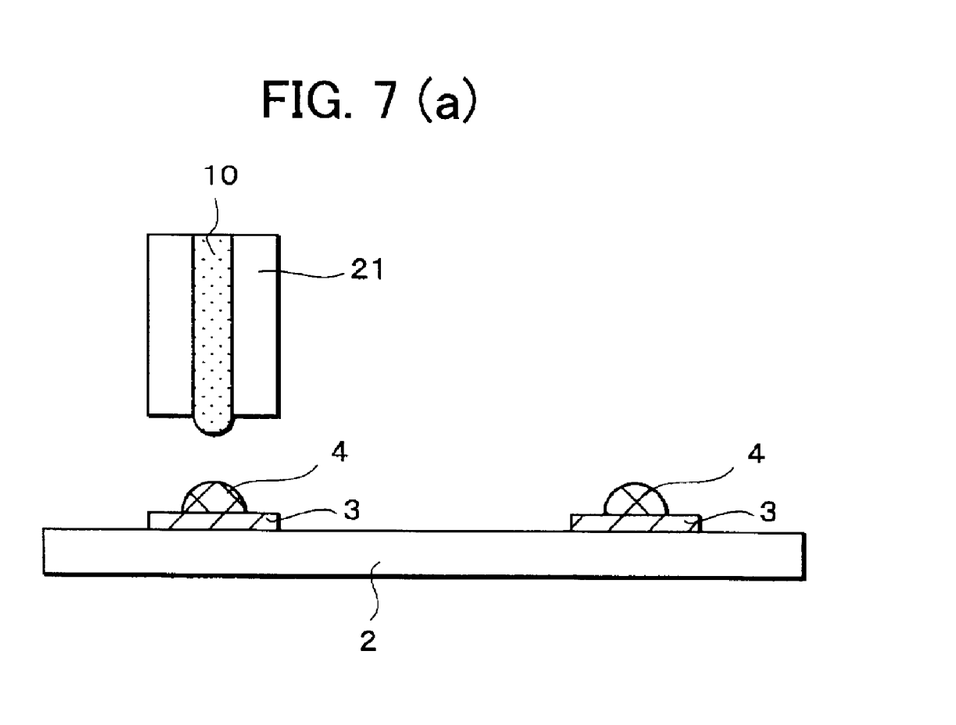
FIGS. 7(a) and 7(b) are flow charts indicating manufacturing steps from the formation of the bumps to the formation of combining parts, among the alternative manufacturing steps of the semiconductor device illustrated in FIG. 1.

Incidentally, the shear strength of the bumps 4 formed as above is 200 g per bump. The shear strength is, as illustrated in FIG. 5, the force exerted in the directions indicated by arrows.

Moreover, when the electronic components are combined with each other by solder, flux is generally used so that a step for providing the flux on the combining surface and a step for removing the flux are required.

However, the conductive combining material 10 includes metal so as to be conductive, and hence the electrode pads 3 and 6 are electrically connected due to the conductive combining material 10, and at the same time the semiconductor chips 1 and 2 are combined with each other.

Thus, it is unnecessary to use the flux as above to combine the semiconductor chip 1 with the semiconductor chip 2. Also, in the whole manufacturing steps of the semiconductor device, it is unnecessary to apply solder, for instance, to the electrode pads 3 and 6 to connect them to other components. On this account, fewer manufacturing steps are required and thus the cycle time can be reduced, and consequently the productive efficiency is improved. Furthermore, lead is not used in any one of manufacturing steps of the semiconductor device so that this arrangement does not have an adverse effect on the environment.

Also, after forming the bumps 4 by hardening the epoxy resin 7, the conductive combining material 10 is hardened so that the semiconductor chip 1 is combined with the semiconductor chip 2.

Thus, the space between the semiconductor chips 1 and 2 is adjusted by the height of the bumps 4. In this manner, the space is controlled by the bumps 4 rather than metal particles, etc. so that, for instance, even if the epoxy resin 7 is formed using the mask and nozzle, the diameter of the particles (silver in this case) included in the epoxy resin 7 is small, and hence the size of the particles does not restrain the thickness of the space. On this account, it is possible to provide a semiconductor device in which electronic components face each other with an arbitrary space.

In this manner, the above-identified semiconductor device can have an arbitrary space between the combined semiconductor chips 1 and 2 and requires fewer manufacturing steps.

Incidentally, either one of the semiconductor chips 1 and 2 is mounted on the bonding stage or the bonding tool of the flip chip bonder. Also, for instance, a possible arrangement is such that the semiconductor chip on which the bumps are formed is mounted on the bonding stage of the flip chip bonder, while the other semiconductor chip on which the conductive combining material is formed is mounted on the bonding tool. Moreover, there is another possible arrangement such that (i) the wiring substrate on which only the electrode pads are formed or (ii) the wiring substrate on which the bumps and the conductive combining material are provided is mounted on the bonding stage.

Furthermore, although the number of the bumps 4 is not particularly limited, the bumps 4 are preferably not less than 3 for the sake of producing the space between the semiconductor chips 1 and 2 uniformly. When the semiconductor chip 2 has, for instance, square shape, it is preferable that the bumps 4 are provided at not less than 3 out of 4 corners of the semiconductor chip 2, and it is further preferable that all 4 corners have the bumps 4.

On this account, it is possible to keep the space between the semiconductor chips 1 and 2 uniform so as to provide a highly reliable semiconductor device.

[Embodiment 2]

The following description will discuss a second embodiment in accordance with the present invention in reference to FIGS. 4(a), 4(b), and 6(a) through 7(b). By the way, members having the same functions as those described in Embodiment 1 are given the same numbers, so that the descriptions are omitted for the sake of convenience.

A manufacturing method of a semiconductor device in accordance with the second embodiment is another example of the manufacturing method of the semiconductor device of embodiment 1, illustrated in FIG. 1.

First of all, referring to FIGS. 6(a) through 6(c), steps until the formation of the bumps 4 on the semiconductor chip 2 are described.

On the semiconductor chip 2, circular electrode pads 3 each 300 $\mu$m in diameter are formed (FIG. 6(a)). Likewise, the electrode pads 6 are formed on the semiconductor chip 1.

Then using a dispense nozzle (discharging member) 20 which is 100 $\mu$m in bore diameter and 300 $\mu$m in external diameter, the epoxy resin 7 including silver is discharged on arbitrary electrode pads 3 on the semiconductor chip 2 (step for discharging, FIG. 6(b)).

Subsequently the semiconductor chip 2 on which the epoxy resin 7 has been discharged is exposed to nitrogen gas and heated for 30 minutes at 160° C., so that the epoxy resin 7 is hardened and the bumps 4 are formed (step for forming spacers, FIG. 6(c)).

As described above, the epoxy resin 7, which becomes the bumps 4 later, is discharged on the semiconductor chip 2 from the dispense nozzle 20 so as to be formed thereon, and hence it is possible to acquire the bumps 4 having an arbitrary size by appropriately choosing the shape, size, and discharging conditions of the dispense nozzle 20.

Now, the discharging conditions are such that discharging pressure, discharging (pressurizing) time, whether or not inhalation is conducted immediately after the discharging, inhalation pressure, inhalation time, tip shape and size of the dispense nozzle 20, etc.

Arbitrarily shaped bumps 4 can be acquired in this arrangement so that the space between a plurality of the electronic components can be set at arbitrary thickness, when the plurality of the electronic components is combined with each other.

Next, referring to FIGS. 7(a) and 7(b), what is described below is steps (collectively termed a step for arranging combining material) until the conductive combining material 10 to be combining parts 5 is provided on the semiconductor chip 2 on which the bumps 4 are formed.

Using a dispense nozzle (combining material discharging member) 21 which is 100 $\mu$m in bore diameter and 300 $\mu$m in external diameter, the conductive combining material 10 is discharged on the electrode pads 3 on which the bumps 4 are formed (FIG. 7(a)). In this case, the conductive combining material 10, discharged on the electrode pads 3, covers either the whole bumps 4 or only a part of the bumps 4.

The conductive combining material 10 is liquid resin so as to spontaneously take a rounded shape (FIG. 7(b)).

As above stated, it is possible to provide the conductive combining material 10 on the semiconductor chip 2 with ease, by discharging the conductive combining material 10 from the dispense nozzle 21 and giving shape thereto.

After the step above, the step for combining the semiconductor chips 1 and 2 is identical with the step of embodiment 1 illustrated in FIGS. 4(a) and 4(b).

The shear strength of the bumps 4 formed as above is 450 g per bump. The shape of the bumps 4 is substantially a sphere without the lower half, 270 $\mu$m in diameter and 60 $\mu$m in height.

In the present embodiment, the bumps 4 and the conductive combining material 10 are both provided by discharging. However, either of the formation of the bumps 4 or the formation of the conductive combining material 10 may be done by printing as described in embodiment 1.

As described above, the manufacturing method of the semiconductor device in accordance with the present invention, in which a semiconductor chip 1 and a semiconductor chip 2 face each other and are combined with each other via bumps 4 for keeping a distance between the semiconductor chip 1 and the semiconductor chip 2 constant, includes the steps of: (a) forming the bumps 4 on electrode pads 3 provided on the semiconductor chip 2, by hardening epoxy resin 7; (b) providing conductive combining material 10 on at least a part of one of the electrode pads 3 or on at least a part of one of the bumps 4; (c) aligning the semiconductor chip 1 with the semiconductor chip 2 so that (i) the bumps 4 contact with electrode pads 6 and (ii) the conductive combining material 10 contact with at least a part of one of the electrode pads 6; and (d) combining the semiconductor chip 1 with the semiconductor chip 2 by hardening the conductive combining material 10, the steps (a) through (d) being carried out in this order.

On this account, it is possible to manufacture the semiconductor device with fewer manufacturing steps and without the restraint of the space between the semiconductor chips 1 and 2 being combined.

That is to say, the manufacturing method of the semiconductor device in accordance with the present invention, in which a first electronic component and a second electronic component face each other and are combined with each other via spacers for keeping a distance between the first electronic component and the second electronic component constant, includes the steps of: (a) forming the spacers on first electrode pads provided on the first electronic component, by hardening liquid resin material made of thermosetting resin; (b) providing liquid conductive combining material, which is made of metal and thermosetting resin, on at least a part of one of the first electrode pads or on at least a part of one of the spacers; (c) aligning the first electronic component with the second electronic component so that (i) the spacers contact with the second electrode pads provided on the second electronic component and (ii) the liquid conductive combining material contact with at least a part of one of the second electrode pads; and (d) combining the first electronic component with the second electronic component by hardening the liquid conductive combining material, the steps (a) through (d) being carried out in this order.

When the electronic components are combined with each other by solder, flux is generally used so that a step for providing the flux on the combining surface and a step for removing the flux are required.

However, according to the above-identified manufacturing method, the liquid conductive combining material for combining the first electronic component with the second electronic component includes metal so as to be conductive. Thus, due to the liquid conductive combining material, the first electrode pads on the first electronic component can be electrically connected to the second electrode pads on the second electronic component, and at the same time, the first electronic component can be physically combined with the second electronic component. In this manner, the first electronic component is combined with the second electronic component using the liquid conductive combining material made of metal and thermosetting resin so that it is unnecessary to use the flux. Moreover, in the whole manufacturing steps of the semiconductor device, it is unnecessary to use solder to connect, for instance, the first and second electrode pads to other members, and hence fewer manufacturing steps are required.

Thus the cycle time can be reduced, and consequently the productive efficiency is improved. Furthermore, lead is not used in any one of manufacturing steps of the semiconductor device so that this arrangement does not have an adverse effect on the environment.

Generally, a temperature around 260° C. is required to combine the electronic components with each other using solder.

However, when the first and second electronic components are combined using the liquid conductive combining material which includes metal and thermosetting resin, a temperature required for the combining is around 160° C. Thus it is possible to prevent the degradation and deformation of the spacers which are formed beforehand by hardening the liquid resin material made of thermosetting resin.

Moreover, according to the arrangement above, after the spacers are formed by hardening the liquid conductive combining material in the step (a), the first electronic component is combined with the second electronic component by hardening the liquid conductive combining material in the step (d). Thus it is possible to regulate the thickness of the space between the first and second electronic components by changing the height of the spacers. In this manner, the thickness of the space is regulated by the spacers rather than granular metal, etc. so that, for instance, even if the liquid resin material is formed using a mask and a nozzle, the diameter of the particles in the liquid resin material is small enough and hence this does not limit the thickness of the space. On this account, it is possible to provide a semiconductor device in which the electronic components face each other with an arbitrary distance.

Furthermore, the manufacturing method of the semiconductor device in accordance with the present invention, in which a first electronic component and a second electronic component face each other and are combined with each other via spacers for keeping a distance between the first electronic component and the second electronic component constant, includes the steps of: (a) forming the spacers on first electrode pads provided on the first electronic component, by hardening liquid resin material made of thermosetting resin; (b) providing liquid conductive combining material, which is made of metal and thermosetting resin, on second electrode pads provided on the second electronic component; (c) aligning the first electronic component with the second electronic component so that (i) the spacers contact with the second electrode pads and (ii) the liquid conductive combining material contact with at least a part of one of the first electrode pads; and (d) combining the first electronic component with the second electronic component by hardening the liquid conductive combining material, the steps (a) through (d) being carried out in this order.

According to the above-identified manufacturing method, the liquid conductive combining material for combining the first electronic component with the second electronic component includes metal so as to be conductive. Thus, due to the liquid conductive combining material, the first electrode pads on the first electronic component can be electrically connected to the second electrode pads on the second electronic component, and at the same time, the first electronic component can be physically combined with the second electronic component. In this manner, the first electronic component is combined with the second electronic component using the liquid conductive combining material made of metal and thermosetting resin so that it is unnecessary to use the flux, and hence fewer manufacturing steps are required.

Thus the cycle time can be reduced, and consequently the productive efficiency is improved. Furthermore, lead is not used in any one of manufacturing steps of the semiconductor device so that this arrangement does not have an adverse effect on the environment.

Also, since the first and second electronic components are combined with each other using the liquid conductive combining material which includes metal and thermosetting resin, a temperature required for the combining is around 160° C. Thus it is possible to prevent the degradation and deformation of the spacers which are formed beforehand by hardening the liquid resin material made of thermosetting resin.

Moreover, after the spacers are formed by hardening the liquid conductive combining material in the step (a), the first electronic component is combined with the second electronic component by hardening the liquid conductive combining material in the step (d). Thus it is possible to regulate the thickness of the space between the first and second electronic components by changing the height of the spacers. In this manner, the thickness of the space is regulated by the spacers rather than granular metal, etc. so that, for instance, even if the liquid resin material is formed using a mask and a nozzle, the diameter of the particles in the liquid resin material is small enough and hence this does not limit the thickness of the space. On this account, it is possible to provide a semiconductor device in which the electronic components face each other with an arbitrary distance.

The manufacturing method of the semiconductor device as above preferably includes the steps of: (e) providing a mask for spacers, which has openings, on the first electronic component, so as to align the openings with areas of the first electrode pads, the spacers being formed in the areas; (f) infusing the liquid resin material into the openings by printing with the use of the mask for spacers; and (g) forming the liquid resin material on the first electrode pads by removing the mask for spacers from the first electronic component, the step (a) being carried out after the steps (e) through (g) are carried out in this order.

According to this arrangement, it is possible to provide the liquid resin material, which is to be the spacers, on the first electronic component, by printing with the use of the mask for spacers. Thus it is possible to provide all of the liquid resin material on the first electrode pads of the first electronic component at once. In other words, it is possible to form all of the spacers on the first electrode pads at once.

On this account, it is possible to reduce the time necessary for the steps carried out before conducting the step (a). Also, for instance, even if the number of the first electrode pads is increased so that the number of the sets of the liquid resin material to be formed is increased, the time for the steps ((e), (f), and (g)) carried out before the step (a) is not increased, and hence the manufacturing efficiency can be improved.

Moreover, it is possible to acquire the spacers having an arbitrary size by regulating the size and the thickness of the openings of the mask for spacer appropriately. The first electronic component and the second electronic component face each other via the spacers. Thus, owing to the spacers, it is possible to keep the distance between the first and second electronic components constant. Consequently, it is possible to set the size of the spacers arbitrarily so that the distance between a plurality of the electronic components can be arbitrarily arranged, when the plurality of the electronic components are combined with each other.

The manufacturing method of the semiconductor device as above preferably includes the step of: (h) discharging the liquid resin material onto the first electrode pads from a discharging member in which the liquid resin material is charged, the step (a) being carried out after the step (h).

According to this arrangement, the liquid resin material to be the spacers is discharged from the discharging member (such as a dispense nozzle) so that the liquid resin material is provided on the first electronic component.

Thus, it is possible to acquire the spacers having an arbitrary size by appropriately choosing the shape, size, and discharging conditions of the nozzle, of the discharging member, from which the liquid resin material is discharged. Also, it is possible to set the size of the spacers arbitrarily so that the distance between a plurality of the electronic component can be arbitrarily arranged, when the plurality of the electronic components are combined with each other.

The manufacturing method of the semiconductor device as above is preferably arranged such that the step (b) includes the steps of: (i) providing a combining mask, which has combining openings, on either one of the first electronic component and the second electronic component which is provided with the liquid conductive combining material, so as to provide the spacers in the combining openings; (j) infusing the liquid conductive combining material into the combining openings, by printing with the use of the combining mask; and (k) forming the liquid conductive combining material by removing the combining mask from the first or second electronic component on which the combining mask is provided, the steps (i) through (k) being carried out in this order.

According to this arrangement, the liquid conductive combining material, which is for combining the first electronic component with the second electronic component, can be provided by printing using the combining mask. Thus it is possible to provide all of the liquid conductive combining material at once, on either one of the first electrode pads of the first electronic component and the second electrode pads of the second electronic component which is provided with the liquid conductive combining material. In other words, it is possible to combine the first electronic component with the second electronic component at once.

This makes it possible to reduce the time required for the step (b), so that the manufacturing efficiency can be improved.

The manufacturing method of the semiconductor device as above is preferably arranged such that, in the step (b), the liquid conductive combining material is discharged from a combining material discharging member in which the liquid conductive combining material is charged, so that the liquid conductive combining material is provided.

According to this arrangement, it is possible to provide the liquid conductive combining material on either one of the first and second electronic components which is provided with the liquid conductive combining material, by discharging the material from the combining material discharging member (such as a dispense nozzle). Thus it is possible to provide the liquid conductive combining material easily.

The manufacturing method of the semiconductor device as above is preferably arranged such that at least one of the first electronic component and the second electronic component is a semiconductor chip.

According to this arrangement, it is possible, for instance, to provide the semiconductor device, in which a plurality of the semiconductor chips is combined with each other, with fewer manufacturing steps.

The manufacturing method of the semiconductor device as above is preferably arranged such that either one of the first electronic component and the second electronic component is a wiring substrate.

According to this arrangement, it is possible, for instance, to provide the semiconductor device, in which a semiconductor chip is mounted on a wiring substrate, with fewer manufacturing steps.

The manufacturing method of the semiconductor device as above is preferably arranged such that the liquid resin material is made of liquid resin including metal and thermosetting resin.

According to this arrangement, the liquid resin material includes metal so that the spacers are conductive. Thus both the liquid conductive combining material and the spacers are conductive, and hence it is possible to further confirm the electrical connection between the first and second electrode pads.

The manufacturing method of the semiconductor device as above is preferably arranged such that the number of the spacers is not less than 3, and when the first electronic component has a rectangular shape, at least each corner of the first electronic component has one of the spacers.

According to this arrangement, it is possible to confirm the uniformity of the space between the first and second electronic components, and this makes it possible to provide a highly reliable semiconductor device.

The semiconductor device of the present invention is characterized in that the semiconductor device of the present invention is manufactured by the above-identified manufacturing method.

According to this arrangement, it is possible to provide the semiconductor device without the limit of the space between first and second electronic components being combined, and fewer manufacturing steps are required for the production.

The semiconductor device of the present invention includes: spacers, provided between first electronic component and second electronic component which face each other, for keeping a distance between the first electronic component and second electronic component constant; and combining parts for combining the first electronic component with the second electronic component, wherein the spacers are made of liquid resin material which is made of thermosetting resin, and the combining parts are made of liquid conductive combining material which is made of metal and thermosetting resin.

According to this arrangement, the combining parts, which are for combining the first electronic component with the second electronic component, include metal so as to be conductive. Thus owing to the combining parts, the first electronic component is electrically connected to the second electronic component, and at the same time the first electronic component is physically combined with the second electronic component. In this manner, the combination of the first and second electronic components is carried out using the liquid conductive combining material made of metal and thermosetting resin so that it is unnecessary to use the flux as in the case of using solder for the combination. Consequently, fewer manufacturing steps are required.

Thus the cycle time is reduced and the manufacturing efficiency is improved.

Moreover, it is possible to regulate the thickness of the space between the first and second electronic components by changing the height of the spacers. Thus, the thickness of the space is regulated by the spacers rather than granular metal, etc. so that the height of the spacers, i.e. the thickness of the space between the first and second electronic components is not limited. On this account, it is possible to provide a semiconductor device in which the electronic components face each other with an arbitrary distance.

The semiconductor device as above is preferably arranged such that the liquid resin material is made of metal and thermosetting resin.

According to this arrangement, the liquid resin material includes metal so that the spacers are conductive. Thus both the liquid conductive combining material and the spacers are conductive and hence it is possible to confirm the electrical connection between the first and second electronic components.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, comprising:
spacers, provided between a first electronic component and a second electronic component which face each other, for keeping a distance between said first electronic component and second electronic component constant; and
combination parts for combining said first electronic component with said second electronic component, while maintaining the distance created by the spacers,
wherein said spacers are made of liquid resin material which is made of thermosetting resin, and said combination parts are made of liquid conductive combining material which is made of metal and thermosetting resin, and said combination parts conforms around the exposed perimeter of said spacers to electrically connect a first electrode pad of said first electronic component with a second electrode pad of said second electronic component, and wherein a combining temperature of the liquid conductive combining material of the combination parts is lower than a combining temperature of solder.

2. The semiconductor device as defined in claim 1, wherein said liquid resin material includes metal and thermosetting resin.

3. The semiconductor device as defined in claim 1, wherein said resin included in said liquid resin material is epoxy resin.

4. The semiconductor device as defined in claim 1, wherein at least one of said first electronic component and second electronic components is a semiconductor chip.

5. The semiconductor device as defined in claim 1, wherein either one of said first electronic component and second electronic components is a wiring substrate.

6. The semiconductor device as defined in claim 1, wherein a number of said spacers is not less than 3.

7. The semiconductor device as defined in claim 1, wherein said first electronic component has a rectangular shape, and at least each corner of said first electronic component has one of said spacers.

8. The semiconductor device as defined in claim 1, wherein each of the spacers has a cylindrical shape.

9. The semiconductor device as defined in claim 1, wherein each of the spacers is shaped like a convex hemisphere.

10. The semiconductor device as defined in claim 1, wherein a temperature required for the combining is approximately 160° C.

* * * * *